United States Patent [19]

Wright

[11] Patent Number: 5,103,157
[45] Date of Patent: Apr. 7, 1992

[54] COMMON EMITTER AMPLIFIERS OPERATING FROM A MULTIPLICITY OF POWER SUPPLIES

[75] Inventor: Michael E. Wright, Berkeley, Calif.

[73] Assignee: National Semiconductor Corp., Santa Clara, Calif.

[21] Appl. No.: 551,427

[22] Filed: Jul. 10, 1990

[51] Int. Cl.⁵ .............................................. G05F 1/565
[52] U.S. Cl. .................... 323/275; 323/281; 323/303; 307/64; 307/66
[58] Field of Search ............... 323/315, 316, 273, 281, 323/268, 269, 271, 272, 303, 349, 350, 351; 330/261, 297; 307/296.1, 296.6, 296.7, 296.8, 44, 48, 66, 64

[56] References Cited

U.S. PATENT DOCUMENTS

| 4,543,522 | 9/1985 | Moreau | 323/303 |
| 4,613,809 | 9/1986 | Skovmand | 323/303 X |
| 4,638,175 | 1/1987 | Bradford et al. | 307/64 |
| 4,779,037 | 10/1988 | LoCascio | 323/281 X |

Primary Examiner—Steven L. Stephan
Assistant Examiner—Emanuel Todd Voeltz
Attorney, Agent, or Firm—Steven F. Caserza; Irving Rapapport

[57] ABSTRACT

A technique for operating a common emitter circuit from a plurality of supply voltages. In one embodiment, a current mirror includes a plurality of diode-connected transistors each connected between a source of current and associated supply voltages. Corresponding current mirrors are each connected between an output terminal associated supply voltage leads, thereby providing an output current mirrored from the soure of current, regardless of which of the supply voltages are activated, and regardless of their particular levels. In another embodiment, a regulator includes an output transistor having a plurality of current handling terminals, each connected to an associated supply voltage, and a second current handling terminal coupled to an output terminal. Feedback is provided between the output and the control terminal of the output transistors, insuring a regulated output regardless of which of the supply voltages are active at any given time, and without regard to the specific levels of the plurality of supply voltages. The feedback is provided by a differential input amplifier, or the like, and can derive its supply voltage from a plurality of supply leads utilizing a diode OR connection in order to insure that suitable feedback supply is provided regardless of the levels of the various supply voltages. In another embodiemnt, an operational amplifier circuit includes pull up and pull down output transistors, having their collectors connected to the output terminal, and one of a plurality of emitters connected to one of a plurality of positive supply voltages and negative supply voltages, respectively.

8 Claims, 3 Drawing Sheets

COMMON EMITTER AMPLIFIERS OPERATING FROM A MULTIPLICITY OF POWER SUPPLIES

INTRODUCTION

1. Technical Field

This invention pertains to electronic circuits, and more particularly to common emitter and common source amplifiers capable of operating from a plurality of power supplies.

2. Background

It is often desired to provide an electronic circuit which is capable of operating from a plurality of power supplies. For example, portable computers may include power supply and battery charging circuits which allow the portable computer to properly operate upon application of power from either the internal battery or from a commercial source of AC power.

FIG. 1 is a schematic diagram of a prior art circuit 100 capable of providing a device such as a portable personal computer. Circuit 100 includes power selection circuit 101 which receives either a DC voltage applied to terminal 105 from a rectified AC power supply or a DC voltage from battery 103. Also shown is charging circuit 104 which serves to charge battery 103 when DC power is applied to terminal 105. Power selection circuit 101 includes diodes 106 and 107 connected in a wired OR configuration so as to apply the DC power from terminal 105 or the DC power from battery 103, whichever terminal is connected to the higher voltage, to emitter 108 of PNP transistor 112. Base current from PNP transistor 112 flows to ground via suitable circuitry (not shown) which causes transistor 112 to serve as a voltage regulator, providing a desired voltage level on terminal 110 via collector 109 of transistor 112.

It is desirable to provide a power supply circuit which will provide the desired output voltage of 5.0 volts upon receipt of an input voltage which is only slightly greater than 5.0 volts. Circuit 102 requires at least 5.1 volts applied to its emitter 108 in order to provide 5.0 volts on terminal 110 connected to its collector 109. While power supply selection circuit 101 operates satisfactorily, diodes 106 and 107 produce a voltage drop of approximately 0.7 volts, thereby requiring voltage from battery 103 to remain above approximately 5.8 volts in order to allow circuit 102 to provide the desired 5.0 volts on output terminal 110. Assuming a high beta for PNP transistor 112, the power dissipation of the voltage regulator of FIG. 1 is equal to $P_{DISS} = (V_{in} - V_{out}) I_{out}$; where $P_{DISS}$ = the power dissipation of voltage regulator 101;

$V_{in}$ = the input voltage to voltage regulator 101;

$V_{out}$ = the output voltage of voltage regulator 101 on terminal 110; and $I_{out}$ = the output current of voltage regulator 101.

Thus, for a constant $I_{out}$, and a 5.0 V output voltage, the power dissipation of a voltage regulator is 700% greater with an input voltage of 5.8 volts as compared with an input voltage of 5.1 volt, neglecting transistor 112 base current. For a 5.1 volt minimum input voltage, a 3 cell lead-acid or a 5 cell nickel-cadmium battery is required. For a 5.8 volt minimum input voltage, a four cell lead-acid or a 6 cell nickel-cadmium battery is required. Thus, for a circuit which requires 5.8 volts as opposed to 5.1 volts, the additional cost and weight penalty associated with the circuit of FIG. 1 are 33% when using lead-acid cells and 20% when using nickel-cadmium cells.

U.S. Pat. No. 4,779,037 issued Oct. 18, 1988 on an invention of LoCascio and assigned to National Semiconductor Corporation, the assignee of this invention, describes another voltage regulator utilizing a multiple emitter transistor, which is capable of providing a regulated output voltage in response to supply voltages provided by a battery and a storage capacitor, without the diode drop associated with the use of a diode OR circuit as in FIG. 1.

FIG. 2 is a schematic diagram of a prior art voltage regulator which operates from a single supply voltage V+. Voltage regulator 300 includes differential input amplifier 301 having an inverting input lead 302 connected to a reference voltage Vref. Positive voltage is applied to lead 304 which is connected to emitter 307 of PNP transister 306. Base 308 of transistor 306 is connected to the output lead of differential amplifier and collector 312 of transistor 306 is connected to output terminal 310 and provides output voltage $V_{out}$. A resistor divider is formed of resistors 309 and 311 connected between output terminal 310 and ground, with the tap of the resistor divider connected to noninverting input lead 305 of differential amplifier 301.

In operation, voltage regulator 300 is set to a desired output volta $V_{out}$ by adjusting the ratio of resistors 309 and 311. As the base drive required by transistor 305 changes, for example due to a change in temperature, input voltage, or the current drawn by external circuitry, the output voltage and current of differential amplifier 301 changes, which serves to maintain the magnitude of $V_{out}$ at the desired level. Because differential amplifier 301 has high gain, the voltage difference between differential input leads 302 and 305 is very low. The bias current applied to noninverting input lead 305 of differential amplifier 1 is also very low. Consequently, differential amplifier 301 forces the voltage on differential input lead 305 to be equal to $V_{ref}$ applied to differential input lead 302. Thus, to provide a desired output voltage, $V_{ref}$ is set to $$V_{ref} = \frac{V_{out}}{\left(1 + \frac{R_{309}}{R_{311}}\right)}; \text{ where}$$

$R_{309}$ = the resistance of resistor 309; and $R_{311}$ = the resistance of resistor 311.

FIG. 3 is a schematic diagram of an operational amplifier of the prior art, which operates from a single supply voltage V+. Operational amplifier 400 receives a positive supply voltage on lead 407 and a negative supply voltage on lead 408. Differential input transconductance amplifier 401 receives a differential input signal. The output current from transconductance amplifier 401 is applied to the input lead of amplifier 402, whose output signal is applied to driver circuitry 403. Driver circuitry 403 in turn provides a control signal to the bases of output transistors 404 and 405, which are connected in a common-emitter configuration with their collectors connected in common to output terminal 406.

FIG. 4 is a schematic diagram of a typical prior art current mirror circuit 506, which operates from a single power supply voltage V+. Current mirror circuit 506 includes a first PNP transistor 502 having its emitter connected to positive voltage lead 501, and its collector and base connected in common to current source 504. Current mirror transistor 503 has its emitter connected to the emitter of transistor 502, its base connected to the base of transistor 502, and its collector connected to output terminal 505. Since the emitter-base voltage of transistor 503 is equal to the emitter-base voltage of transistor 502, the collector of transistor 503 supplies a current Iout to output terminal 505 which is equal to the current I supplied by current source 504 multiplied by the emitter area ratio of transistors 502 and 503. For example, when transistors 502 and 503 are matched, then $I_{out}=I$.

There remains the need to provide circuits which are capable of operating from a plurality of supply voltages, which are simple, inexpensive, and do not themselves consume a significant amount of power due to their ability to operate from a plurality of supply voltages.

SUMMARY

In accordance with the teachings of this invention, a novel technique is used for operating a common emitter circuit from a plurality of supply voltages. In one embodiment of this invention, a voltage selection circuit is taught which includes a plurality of transistors having their bases connected in common, their collectors connected in common, and each having an emitter connected to an associated one of a plurality of supply voltages. The transistors draw current from the highest supply voltage.

In accordance with one embodiment of this invention, a novel current mirror is taught including a plurality of diode-connected transistors connected between a current source and an associated one of a plurality of supply voltages. A corresponding number of current mirror devices are connected between an output terminal and an associated one of the plurality of supply voltage leads, thereby providing that the output terminal provides a current mirrored from the current source, regardless of which one or more of the supply voltages are activated at any given time, and regardless of their particular levels.

In another embodiment of this invention, a regulator circuit is taught including an output transistor having a plurality of first current handling terminals, each connected to an associated one of a plurality of supply voltages, and a second current handling terminal coupled to an output terminal. Control is provided between the output and the control terminal of the output transistor, thereby insuring a regulated output signal of a desired level regardless of which one or more of the supply voltages are active at any given time, and without regard to the specific levels of the plurality of supply voltages.

In accordance with the teachings of this invention, the control means may comprise a differential input amplifier, or the like. If desired, the control means can derive its own supply voltage from a plurality of supply leads utilizing the diode OR connection in order to insure that a suitable supply voltage is provided to the control means regardless of the levels of the various supply voltages.

In another embodiment of this invention, an operational amplifier circuit includes a pull up and a pull down output transistor, each having its collector connected to the output terminal, and one of a plurality of emitters connected to one of a plurality of positive supply voltages and negative supply voltages, respectively.

DETAILED DESCRIPTION

Figure 1:
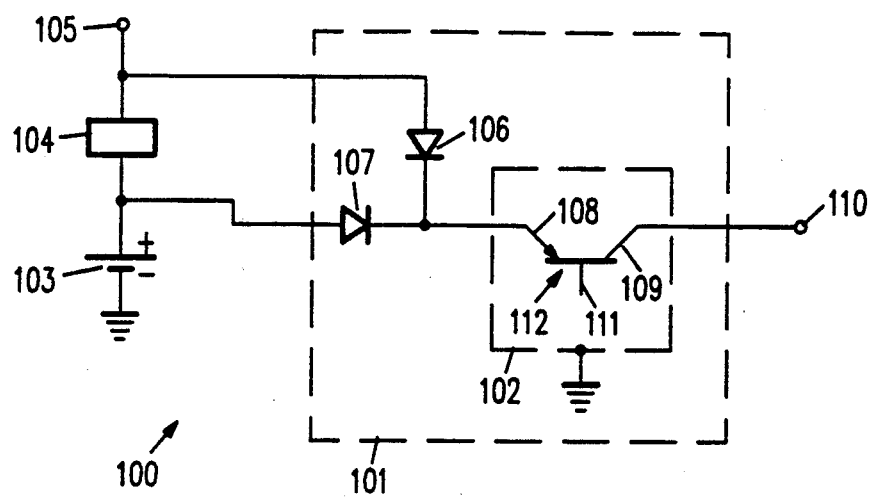
FIG. 1 is a schematic diagram of a typical prior art voltage selection circuit.
Figure 2:
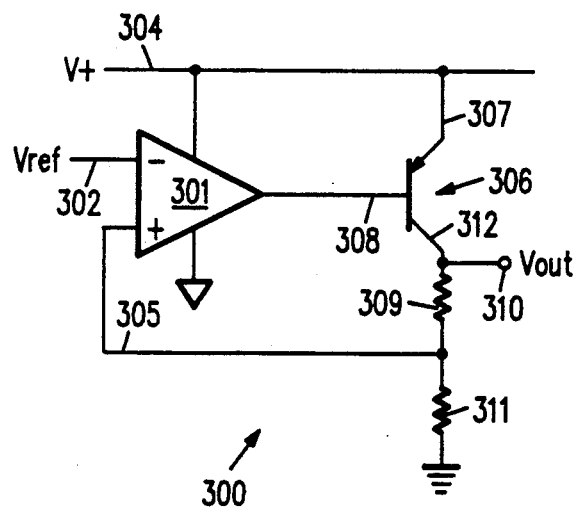
FIG. 2 is a schematic diagram of a typical prior art regulator circuit.
Figure 5:
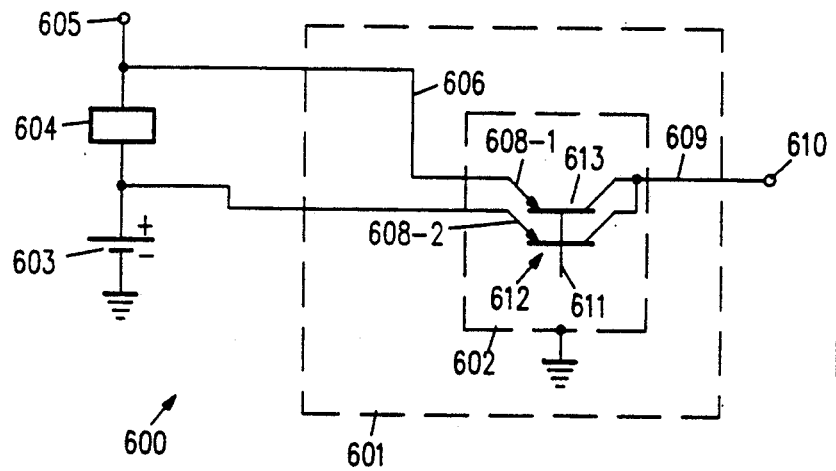
FIG. 5 is a schematic diagram of one embodiment of a voltage selection circuit constructed in accordance with the teachings of this invention which utilizes two poweer supply voltages which are selected by connecting each to the emitter of an associated pass transistor.

FIG. 5 is a schematic diagram of power selection circuit 600 constructed in accordance with the teachings of this invention which is similar to that shown in FIG. 1, but constructed so as to not require wired OR connection of diodes 106 and 107 (FIG. 1). As shown in FIG. 5, pass transistors 612 and 613 of common-emitter voltage regulator circuit 602 includes two emitters 608-1 and 608-2. Emitter 608-1 is connected to DC power supply terminal 605. Emitter 608-2 is connected to battery 603. When the voltage on one emitter is higher than 5.1 volts, the emitter will forward bias and terminal 610 will provide a regulated voltage of 5.0 volts. If the battery is connected and the DC power source is disconnected, then terminal 606 will be at a low voltage and transistor 613 will turn off, reaching a high resistance state that allows transistor 612 to operate normally. In this circuit, the two diodes 106, 107 and transistor 112 of the prior art circuit of FIG. 1 are replaced by two transistors 612 and 613. As in the case of the prior art circuit of FIG. 1, current is drawn by the higher of the two voltages applied to emitters 608-1 and 608-2. If both voltages are of equal voltage, current is drawn by both emitters 608-1 and 608-2 in proportion to their emitter areas. Since a diode, in an integrated circuit, is fabricated as a transistor having its base connected to its collector and having an area equal to that of a pass transistor, the integrated circuit surface area required for the circuit of FIG. 1 is equal to the surface area required to provide three unit-size power transistors. The integrated circuit surface area of the circuit of FIG. 5 is equal to that required for two unit-size power transistors. Thus, voltage drop, power consumption, and integrated circuit surface area are simultaneously reduced utilizing the circuit of FIG. 5. In a monolithic fabrication process, parallel connected pass transistors 612 and 613 are fabricated to share collector and base regions, thereby achieving an even greater reduction in the integrated circuit surface area required.

Figure 6:
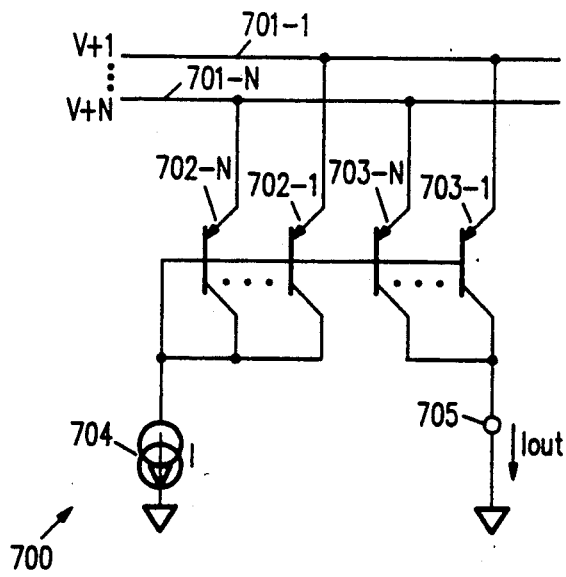
FIG. 6 is a schematic diagram of one embodiment of a current mirror constructed in accordance with the teachings of this invention.

FIG. 6 is a schematic diagram of one embodiment of a current mirror circuit 700 constructed in accordance with the teachings of this invention which is capable of operating from any one or more of a plurality of voltage sources. Current mirror circuit 700 includes a plurality of power supply leads 701-1 through 701-N for receiving a plurality of supply voltages $V_1+$ through $V_N+$, respectively. Circuit 700 includes a plurality of PNP transistors 702-1 through 702-N, having their bases connected in common with their collectors which are also connected in common, and in turn connected to current source 704. The emitters of transistors 702-1 through 702-N are connected to power supply leads 701-1 through 701-N, respectively. In this manner, for a given current I drawn by current source 704, and a given set of supply voltages $V_1+$ through $V_N+$, transistors 702-1 through 702-N each have associated therewith a corresponding emitter-base voltage. Current mirror circuit 700 also includes mirroring transistors 703-1 through 703-N having their bases connected in common to the bases of transistors 02-1 through 702-N, and their collectors connected in common to output terminal 705. The emitters of transistor 703-1 through 703-N are connected to power supply leads 701-1 through 701-N, respectively. Thus, the emitter-base voltage of transistor 703-J, where $1 \leq J > N$, is equal to the emitter-base voltage of transistor 702-J. The magnitudes of voltages $V_1+$ through $V_N+$ determine the emitter-base voltages of transistors 702-1 through 702-N and thus of transistors 703-1 through 703-N, respectively. These emitter-base voltages and the emitter areas determine how current $I_1$ is split among transistors 702-1 through 702-N, and how current $I_{out}$ is split among transistors 703-1 through 703-N. Therefore, output terminal 705 will supply a current Iout equal to the current I supplied by current source 704, regardless of the particular voltages $V_1+$ through $V_N+$. As will be readily appreciated to those of ordinary skill in the art in light of the teachings of this invention, a wide variety of current ratios and degeneration techniques are capable of being used in conjunction with the embodiment of FIG. 6.

Figure 7:
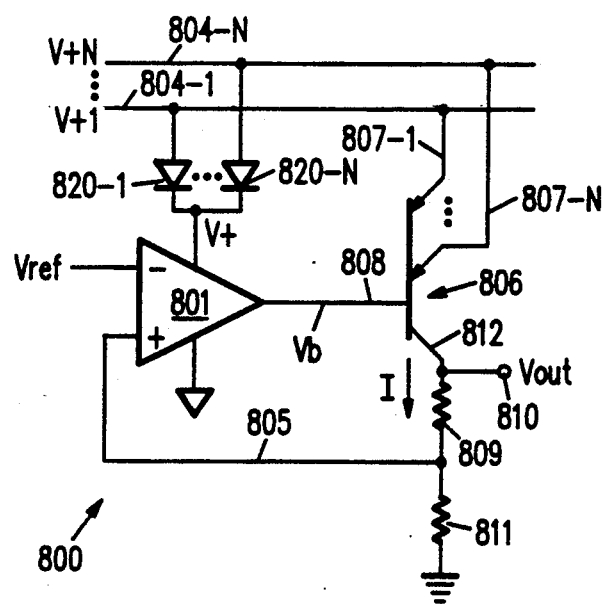
FIG. 7 is a schematic diagram of one embodiment of a regulator circuit constructed in accordance with the teachings of this invention.

FIG. 7 is a schematic diagram of one embodiment of a voltage regulator circuit 800 constructed in accordance with the teachings of this invention and which is capable of operating from a plurality of supply voltages $V_1+$ through $V_N+$. Output transistor 806 includes a plurality of emitters 807-1 through 807-N each connected to voltage supply leads 804-1 through 804-N, respectively, for receiving supply voltages $V_1+$ through $V_N+$, respectively. Differential amplifier 801 receives its positive supply voltage via voltage supply leads 804-1 through 804-N, respectively. In this manner, as long as at least one of supply voltages $V_1+$ through $V_N+$ is at least approximately 0.7 volts greater than the supply voltage requirement of differential amplifier 801, differential input amplifier 801 will receive sufficient supply voltage. Also, as long as at least one of supply voltages $V_1+$ through $V_N+$ is sufficiently high to provide current flow through transistor 806, output voltage $V_{out}$ will be maintained at a desired level by the action of the feedback path through the resistor divider network of resistors 809 and 811, and noninverting input lead 805 of differential input amplifier 801.

Figure 3:
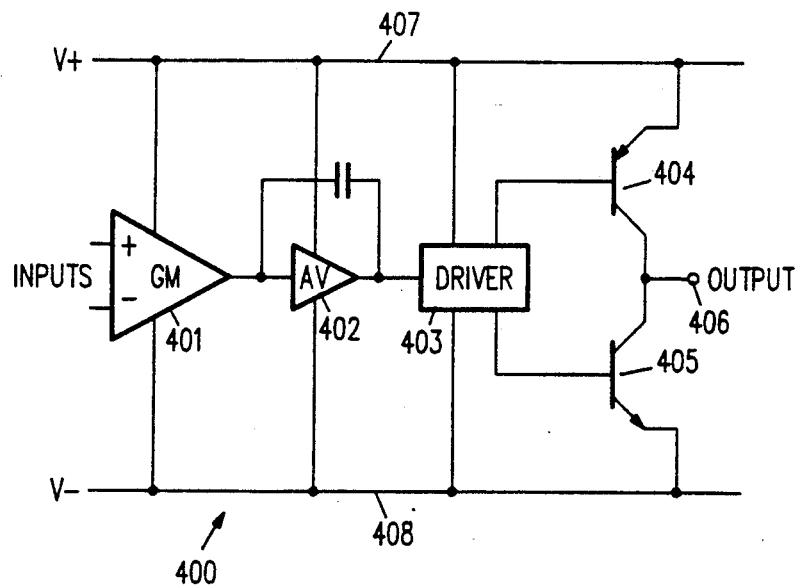
FIG. 3 is a schematic diagram of prior art operational amplifier circuirt.
Figure 8:
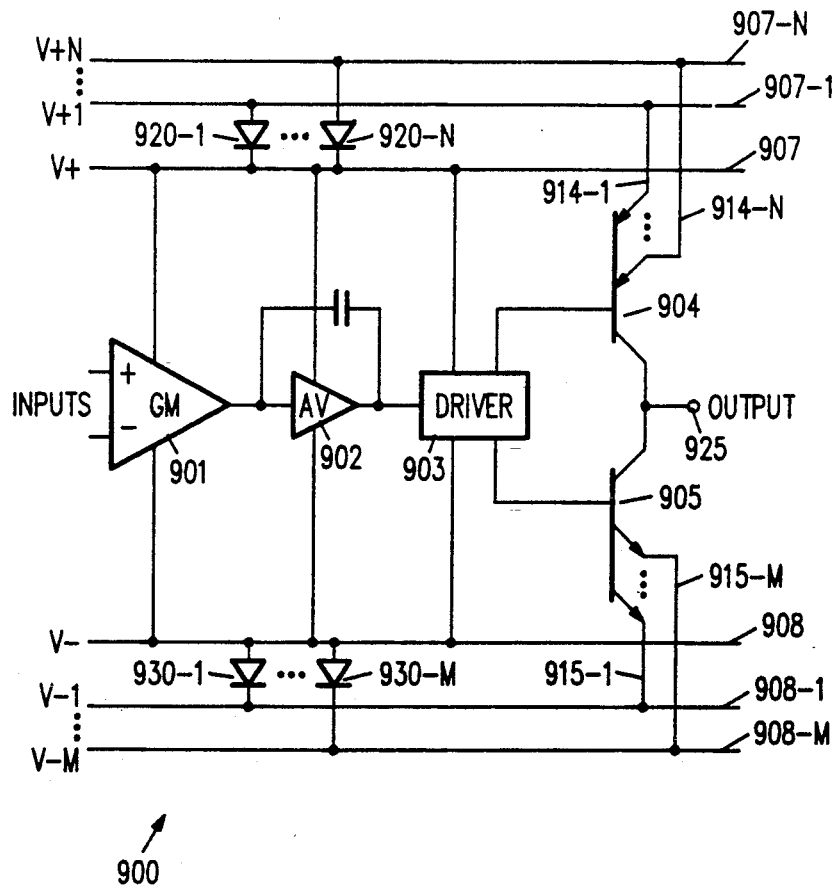
FIG. 8 is a schematic diagram of one embodiment of an operational amplifier constructed in accordance with the teachings of this invention.
Figure 4:
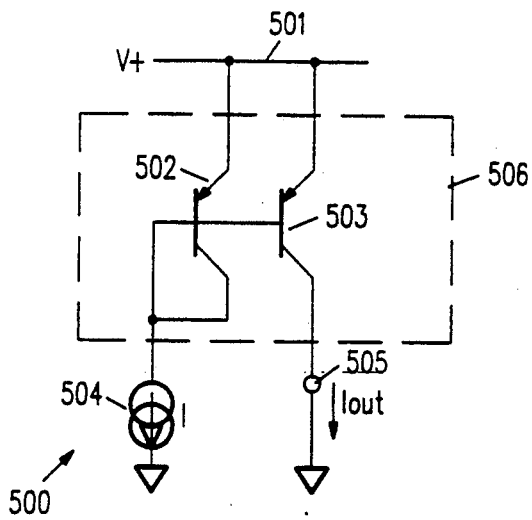
FIG. 4 is a schematic diagram of a typical prior art current mirror circuit.

FIG. 8 is a schematic diagram of an operational amplifier 900 similar to the prior art operational amplifier of FIG. 3, but which is constructed in accordance with the teachings of this invention in order to operate from a plurality of positive supply voltages $V_1+$ through $V_N+$ and a plurality of negative supply voltages $V_1+$ through $V_m+$. Positive supply leads 907-1 through 907-N are connected through diodes 920-1 through 920-N, respectively, to V+ supply bus 907. Similarly, negative supply leads 908-1 through 908-M are connected through diodes 930-1 through 930-M to V− supply bus 908. Supply buses 907 and 908 supply positive and negative supply voltages to differential amplifier 901, amplifier 902, and driver 903 as long as at least one supply voltage $V_1+$ through $V_N+$ and at least one negative supply voltage through $V_1+$ through $V_M+$ are of a required magnitude. Output transistor 904 includes a plurality of emitters 914-1 through 914-N connected to positive supply leads 907-1 through 907-N, respectively. Similarly, output transistor 905 includes a plurality of emitters 915-1 through 915-M connected to negative supply leads 908-1 through 908-M, respectively. If at least one of positive supply voltages $V_1+$ through $V_N+$ is of sufficient magnitude to cause current flow through transistor 905, and at least one of negative supply voltages $V_1+$ through $V_M+$ is of a sufficient magnitude to cause current flow through transistor 905, output transistors 904 and 905 will operate properly in response to the drive signal provided by driver 903 to provide a desired output voltage on output terminal 925. The output voltage on output terminal 925 is maintained at the desired level by feedback signals applied to the differential input leads of differential input amplifier 901.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims. For example, while the examples of this specification describe the use of bipolar transistors, it is also readily appreciated by those of ordinary skill in the art in light of this invention that other transistor types, such as FETs, are also suitable for use with this invention.

What is claimed is:

1. A current mirror comprising:
   a first supply voltage lead for receiving a first supply voltage;
   a second supply voltage lead for receiving a second supply voltage capable of having a voltage different than said first supply voltage;
   a current source;
   an output lead;
   a first transistor connected as a load device between said first supply voltage lead and said current
   a second transistor connected as a load device between said second supply voltage lead and said current source;
   a first mirror transistor coupled between said first supply voltage lead and said output lead in order to mirror to said output lead the current flowing through said first transistor;
   and a second mirror transistor coupled between said second supply voltage lead and said output lead in order to mirror to said output lead the current flowing through said second transistor.

2. A current mirror comprising:
   a plurality of supply voltage leads, each for receiving an associated one of a plurality of supply voltages;

a current source;
an output lead;
a plurality of transistors, each connected as a load device between an associated one of said supply voltage leads and said current source; and
a plurality of mirror transistors, each coupled between an associated one of said supply voltage leads and said output lead in order to mirror to said output lead the current flowing through a corresponding one of said transistors.

3. A regulator circuit comprising:
a plurality of supply voltage leads, each for receiving an associated one of a plurality of supply voltages;
an output terminal for providing a regulated output;
output means coupled between said plurality of supply voltage leads and said output terminal;
sense means coupled to said output terminal; and
control means coupled to said sense means for providing a control signal to said output means in order to provide a regulated output on said output terminal,
wherein said output means comprises a transistor circuit comprises:
a plurality of first current handling terminals, each coupled to an associated one of said supply voltage leads;
a second current handling terminal coupled to said output terminal; and
a control terminal for receiving said control signal.

4. A regulator circuit comprising:
a plurality of supply votlage leads, each for receiving an associated one of a plurality of supply voltages;
an output terminal for providing a regulated output;
output means coupled between said plurality of supply voltage leads and said output terminal;
sense means coupled to said output terminal; and
control means coupled to said sense means for providing a control signal to said output means in order to provide a regulated output on said output terminal, wherein said control means comprises:
a differential input amplifier having a first input lead for receiving a reference signal setting the desired output level, a second input lead coupled to said sense means, an output lead for providing said control signal, and a power supply lead; and
a plurality of diodes, each coupled between an associated one of said supply voltage leads and said power supply lead of said differential amplifier.

5. An operational amplifier circuit comprising:
a plurality of first supply voltage leads, each for receiving an associated one of a plurality of first supply voltages;
a plurality of second supply voltage leads, each for receiving an associated one of a plurlaity of second supply voltages;
an output terminal;
first output means coupled between said plurality of first supply voltage leads and said output terminal; and
second output means coupled between said plurality of second supply voltage leads and said output terminal.

6. An operational amplifier circuit as in claim 1, wherein:
said first output means comprises a transistor circuit comprising:
a plurality of first current handling terminals, each coupled to an associated one of said first supply voltage leads,
a second current handling terminal coupled to said output terminal; and
a control terminal for receiving at least one control signal; and
said second output means comprises a transistor circuit comprising:
a plurality of first current handling terminals, each coupled to an associated one of said second supply voltage leads;
a second current handling terminal coupled to said output terminal; and
a control terminal for receiving at least one control signal.

7. An operational amplifier circuit as in claim 6 which further includes control means which comprises:
a differential input amplifier having a first input lead for receiving a reference signal defining the desired output level, a second input lead coupled to means for sensing the output level, an output lead for providing at least one of said control signals, a first power supply lead, and a second power supply lead;
a first plurality of diodes, each coupled between an associated one of said first supply voltage leads and said first power supply lead of said differential amplifier; and
a second plurality of diodes, each coupled betwen an associated one of said second supply voltage leads and said second power supply lead of said differential amplifier.

8. A power supply circuit comprising:
a plurality of supply voltage leads for receiving a plurality of supply voltages;
an output lead; and
a plurality of pass transistors, each having a first current carrying lead coupled to an associated one of said plurality of supply voltage leads, a second current handling lead coupled to said output lead, and a control lead, each of said control leads being connected in common;
whereby said output terminal provides a regulated output voltage supplied by at least one of said plurality of supply voltages.

* * * * *